United States Patent [19]

Mellen et al.

[11] 4,214,215
[45] Jul. 22, 1980

[54] LOW NOISE-HIGH GAIN JFET AMPLIFIER FOR A PIEZOELECTRIC TRANSDUCER

[75] Inventors: Arthur J. Mellen, Clearwater, Fla.; Adolf Reitlinger, Kingston, N.Y.

[73] Assignee: Contact Communication Corporation, Clearwater, Fla.

[21] Appl. No.: 930,364

[22] Filed: Aug. 2, 1978

[51] Int. Cl.² ............................................. H03F 3/185
[52] U.S. Cl. ................................... 330/277; 330/297; 330/300
[58] Field of Search ................... 330/3, 277, 297, 300; 179/1 A

[56] References Cited

U.S. PATENT DOCUMENTS

| | | | |
|---|---|---|---|
| 3,436,672 | 4/1969 | Delagrange | 330/277 |
| 3,462,701 | 8/1969 | Miller | 330/277 |
| 3,501,711 | 3/1970 | Moran | 330/297 |
| 4,009,447 | 2/1977 | Wolf et al. | 330/110 |
| 4,092,701 | 5/1978 | Bumgardner | 330/300 X |

OTHER PUBLICATIONS

Towers, "High Input-Impedance Amplifier Circuits", *Wireless World*, Jul. 1968, pp. 197-201.
"Product Survey: Field-Effect Transistors", *Electronic Design*, Apr. 26, 1963, pp. 66-69.

*Primary Examiner*—James B. Mullins
*Attorney, Agent, or Firm*—Birch, Stewart, Kolasch & Birch

[57] ABSTRACT

A low-noise junction field effect depletion mode transistor amplifier and a signal retrieval network therefor is described. The junction (JFET) is used to amplify the signal from a piezoelectric transducer which forms the sensing element of a bone conduction microphone. A conventional transistor or Darlington pair is provided with a base electrode coupled to the source electrode of the JFET and a collector electrode coupled to the JFET drain electrode. The emitter circuit of the transistor includes a first voltage divider for feeding back a portion of the emitter signal to the base circuit of the transistor and another portion to the gate circuit of the JFET through the piezoelectric transducer. A second voltage divider is provided in the feedback path from the first divider to the transistor base to apply a portion of the base feedback signal to the JFET gate through the gate input resistor. By suitably selecting a high enough bias voltage for the JFET and by provision of the output transistor and associated feedback, the amplified output signal can be taken from either of the D.C. bias supply lines, namely, the positive line from the drain electrode of the JFET or the negative supply line at the bottom of the first voltage divider. Further solid state circuit means are provided for retrieving the amplified output signal from either of said supply lines with maximum gain and signal output.

6 Claims, 6 Drawing Figures

LOW NOISE-HIGH GAIN JFET AMPLIFIER FOR A PIEZOELECTRIC TRANSDUCER

BACKGROUND OF THE INVENTION

1. Field of the Invention

The present invention relates to a low-noise junction field effect depletion mode transistor amplifier and circuitry for retrieving the amplified signal therefrom. More specifically, the present invention relates to a low-noise junction field effect transistor amplifier for amplifying a signal generated by the piezoelectric transducer of a bone conduction microphone.

2. Description of the Prior Art

Bone conduction microphones for transmitting speech communications are generally known in the prior art. These microphones generally comprise a piezoelectric crystal which is attached to a bony portion of the human body such as the top of the head or skull. These microphones offer the advantage that the speech intelligence to be transmitted is transmitted directly through the bone of the speaker to the piezoelectric crystal of the microphone and therefore does not pick up any ambient noise or sound such as would be picked up by a conventional microphone held in front of the speakers mouth. Examples of such prior art bone conduction microphones can be found in U.S. Pat. No. 3,723,670 to Sebesta et al; U.S. Pat. No. 3,787,641 to Santori; and U.S. Pat. No. 2,255,250 to Greibach; and U.S. Pat. No. 3,087,028 to Bonnin.

In each of the above bone conduction microphones there is a need for a high gain low-noise solid state amplifier which can be contained in a compact arrangement within the housing of the microphone per se. It is generally known that field effect transistors (FET) function relatively well as active amplifying elements for the output signal of a piezoelectric transducer. However, heretofore the conventional FET amplifier arrangements have not possessed sufficiently low noise levels to operate effectively as the amplifier of a bone conduction microphone.

SUMMARY OF THE INVENTION

Accordingly, it is the primary object of the present invention to provide an amplifier for a bone conduction microphone with a high gain and higher signal to noise ratio than amplifiers for bone conduction microphones known heretofore.

It is a further object of the present invention to provide an amplifier for a bone conduction microphone which is a two terminal network, the output signal of the amplifier being taken off of either of the DC power lines rather than from a third wire or point connected between the power lines.

It is still a further object of the present invention to provide signal retrieval circuitry for retrieving the amplified signal from one of said DC power lines with maximum gain and a minimum amount of noise.

The objects of the present invention are fullfilled by providing feedback circuit means between the output and input of a junction field effect depletion mode transistor amplifier which enables the input resistance of the JFET circuit to be substantially reduced, thus minimizing the amount of noise created by the FET. This feedback circuitry includes a transistor of the NPN or PNP type, or a Darlington pair of transistors, with the collector of the transistor coupled to the drain of the JFET and the base of the transistor, or transistor pair, coupled to the source of the JFET. A feedback circuit is provided in the emitter circuit of the transistor, or Darlington pair, in the form of a first voltage divider means which feeds back a portion of the transistor emitter signal to the base of said conventional transistor through a second voltage divider coupled to the source electrode of the JFET. A further signal is fed back directly from the second voltage divider in the source circuit of the JFET through the input resistor of the JFET to the gate of the JFET. The amplified output signal can be taken off either DC supply line of the JFET, namely, at the drain electrode of the JFET or from the bottom of the emitter circuit of the conventional transistor or Darlington pair.

In the simplest form the output signal may be retrieved from either of the supply lines by the provision of a simple parallel RC circuit in series with the supply line, the signal being extracted from the capacitor. However, as will become more fully apparent hereinafter with reference to the detailed description of the drawings, more sophisticated solid state signal retrieval circuitry is provided by the present invention for increasing the gain and the maximum signal output by reducing the DC voltage drop across the impedance of the parallel RC circuit.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the details of the description given hereinbelow and the accompanying drawings which are given by way of illustration only, and thus are not limitative of the present invention and wherein.

DETAILED DESCRIPTION OF THE DRAWINGS

Figure 1:
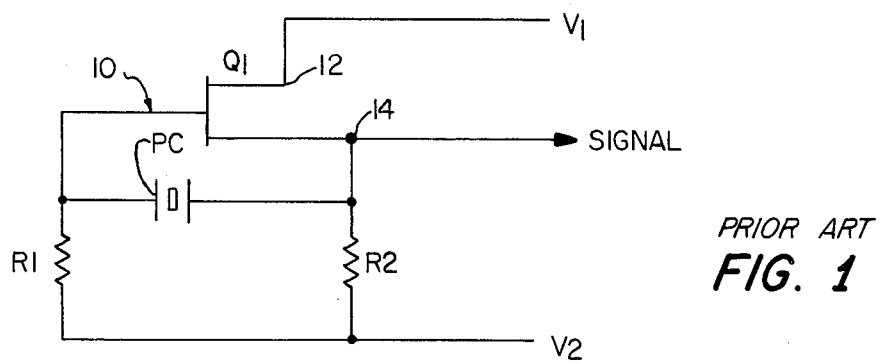
FIG. 1 is an illustration of a typical prior art JFET amplifier in combination with a piezoelectric crystal of a microphone over which the circuitry of the present invention provides an improvement.

An understanding of the present invention can be obtained by reference to FIG. 1 which illustrates a typical type of FET amplifier and piezoelectric crystal combination. The piezoelectric crystal PC illustrated represents the piezoelectric crystal utilized as the transducer element of a bone conduction microphone, which in the present invention may be a bimorph cantilever bender of a lead titanate zirconate ceramic manufactured by Vernitron Co. under the designation PZT5BN. The piezoelectric crystal can have either a 7000 $H_z$ resonance or a 5000 $H_z$ resonance. For the 7000 $H_z$ resonance material (PZT5BN, N for nickel electrodes) with a length of 0.2236 inches plus 0.025 clamp (total 0.2486 inches), a thickness of 0.021 inches and a width of 0.05 inches. The moving effective mass of the crystal is $7.748 \times 10^{-6}$ Kg. The capacitance is 286 $PF = 286 \times 10^{-12}$ farads, with clamp included. A crystal with the above characteristics when connected in the FET amplifier configuration of FIG. 1 requires an input resistance R1 coupled to the gate of the FET of about 1.9 megohms to achieve a $-3DB$ cut-off at 300 $H_z$. With a force of 1 Newton 2236/2486 (the ratio of the cantilevers total length to its free length) of the sensitivity produces 102.6 volts signal output per Newton. As stated above, the moving cantilever mass for such a 7000 $H_z$ resonance crystal is $7.748 \times 10^{-6}$ Kg.

If a 5000 $H_z$ resonance crystal is used the required added loading end mass can be shown to be $6.452 \times 10^{-6}$ Kg. The total effective mass becomes $15.2 \times 10^{-6}$ Kg which at 1G acceleration produces a force of $1.49 \times 10^{-4}$ Newtons in the 5000 Hz resonance crystal. All of the above parameters are well known measures of piezoelectric crystals characteristics and form no part of the present invention.

The purpose of supplying all of the above data is to illustrate the sensitivity achieved. The sensitivity can be calculated as $1.49 \; 10^{-4} \times 102.6 = 1.5 \; 10^{-2}$ v/Newton in 1.9 megohm— $-36.5$ DB Re: 1V/G for the 5000 Hz version. The sensitivity equals $7.5 \; 10^{-3}$ V/G $= -43$ DB Re: 1V/G in 1.9 megohm for the 7000 Hz version. The maximum output at $\frac{1}{8}$ G excitation becomes $-46.$ respectively $-53$ DB Re: 1V.

The sensitivity of the complete unit is the gain in the JFET amplifier Q1 of FIG. 1 times the sensitivity of the piezoelectric crystal given above. The maximum output is also the FET amplifier gain times the maximum output given above. In the circuit of FIG. 1 for purposes of illustration, input resistor R1 is chosen to be 1.9 megohms and resistor R2 is chosen to be 20 kilohms. The DC bias supply across terminals V1, V2 is in the range of 1.0 to 1.5 volts. The JFET is a Siliconix 2N4338.

Referring in more detail to FIG. 1 the piezoelectric crystal PC is connected between the gate 10 and the source 14 terminals of the JFET $Q_1$, and input resistor R1 of 1.9 megohms is coupled between the JFET gate 10 and the negative supply terminal V2. An output resistor R2 of 20 Kohms is coupled between the source of JFET Q1 14 and negative voltage supply terminal V2. The drain terminal is coupled to the positive supply terminal V1. The amplified signal output is retrieved from a source terminal 14 of the JFET and, therefore, the amplifier is a three terminal network including supply terminals V1, V2 and the signal output terminal. It is an object of the present invention, as it will become more fully apparent hereinafter, to reduce the number of output terminals of the FET amplifier from three to two and to substantially reduce the noise which would be generated by the large input resistor R1 of the FET amplifier of FIG. 1. It is a discovery of the present invention that this can be achieved by providing suitable feedback circuitry which enables one to use smaller input resistors R1. A circuit embodying these principles is described and illustrated in FIG. 2.

Figure 2:
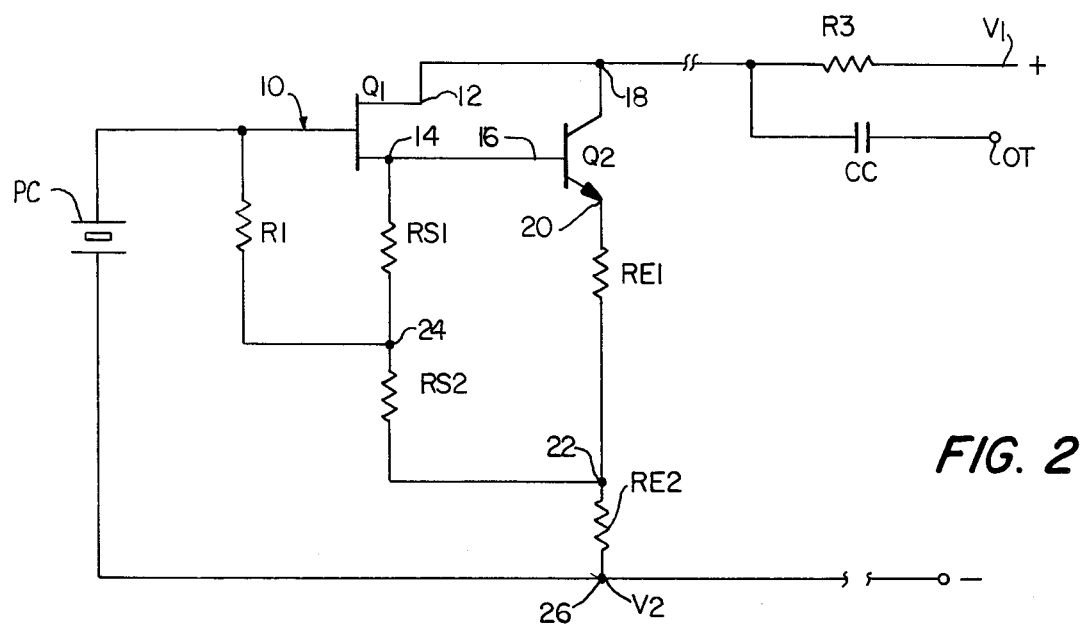
FIG. 2 is a first embodiment of the low-noise JFET amplifier of the present invention.

Referring in detail to FIG. 2 the JFET amplifier Q1 (also a Siliconix 2N4338) has a gate 10, a source 14, and a drain 12. The gate terminal 10 is coupled to one terminal of a piezoelectric crystal PC of a bone conduction microphone and the other terminal of PC is coupled at junction 26 to the negative bias voltage supply line V2 of JFET Q1. A conventional NPN transistor Q2 is provided at the output of the JFET amplifier and has a base electrode 16 directly coupled to source electrode 14 of the JFET and a collector electrode 18 directly coupled to the drain electrode 12 of JFET Q1. The transistor Q2 may comprise a model number 2N930 manufactured by Motorola with a minimum current gain (HFE) of 150. The emitter 20 of transistor Q2 is coupled to negative voltage supply line V2 through a voltage divider comprising resistors RE1 and RE2 which may be 100 and 350 ohms, respectively. A center tap is provided on this voltage divider at 22 and provides a feedback signal path to a second voltage divider comprising resistors RS1 and RS2 of 20 Kohms and 2 Kohms, respectively, coupled in the source circuit of the JFET Q1. The second voltage divider including resistors RS1 and RS2 also includes a center tap at 24 to provide a feedback signal path therefrom through input resistor R1 to the gate of JFET Q1. Thus, there are two feedback paths provided from the emitter circuit of transistor Q2 either via a center tap 22 through resistor RS2 center tap 24 and input resistor R1, or through resistor RS2, RS1 to the base 16 of transistor Q2. The provision of transistor Q2 and the feedback provided by the voltage dividers RE1, RE2 and RS1, RS2 enable the value of input resistor R1 to be selected at a much lower value of 150 Kohms, which substantially reduces the JFET noise created by the input resistor R1 and the loading on sensor PC as compared to the large 1.9 megohms resistor R1 of the circuit of FIG. 1. It has also been found that the circuitry of FIG. 2 enables one to retrieve the output signal of the amplifier either from the positive voltage supply line V1 or the negative voltage supply line V2.

In this regard as illustrated in FIG. 2, the signal is retrieved at terminal OT via output capacitor CC coupled in the positive voltage supply line V1. However, in order to retrieve the signal the resistor R3 must be placed in the supply line V1. This inherently has the effect of limiting the gain of the amplifier as its resistance is limited by the available supply voltage reduction caused by DC current in R3.

Figure 3:
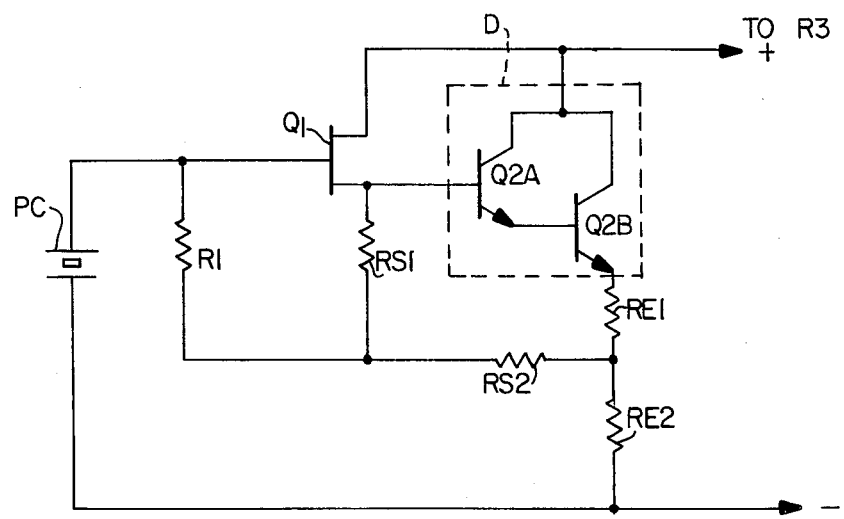
FIG. 3 is a second embodiment of a low-noise JFET amplifier of the present invention.

The circuit of FIG. 3 is substantially identical in configuration and function to the circuit of FIG. 2 with the exception that the NPN transistor Q2 has been replaced by a Darlington pair D comprising transistors Q2A and Q2B. The Darlington connected transistors D increase the forward transfer admittance ($G_m$) of the JFET and provides more amplification in the remote load impedance R3, because $RE_2$ can be smaller than $RE_2$ of FIG. 2. And, as with the single transistor, the boot strapping action or the feedback from the emitter circuit of the transistor or the Darlington pair reduces the size required for the input bias resistor R1 of JFET Q1.

It is a further discovery of applicant's invention that the overall gain of the circuit of FIGS. 2 and 3 can be further increased by reducing the DC voltage drop across resistor R3 of FIGS. 2 and 3 by substituting a transistor Q3 for resistor R3 with a gain (HFE) of more than 100.

Figure 4:
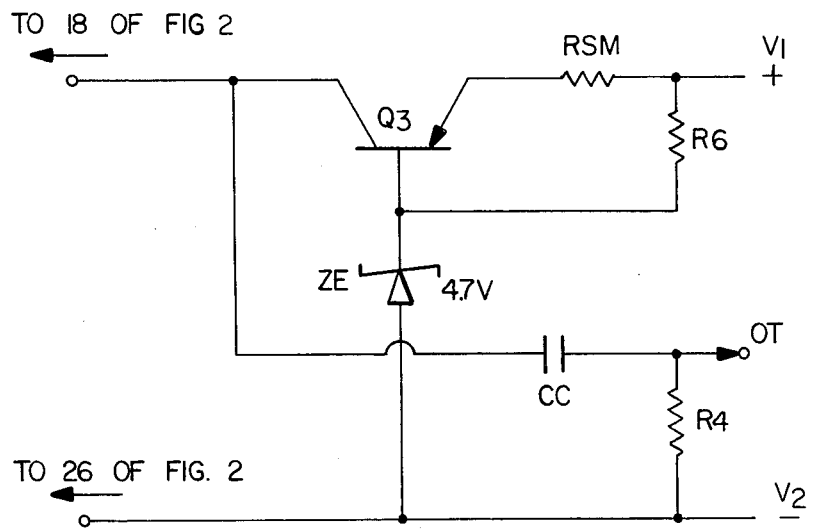
FIG. 4 is a first embodiment of a signal retrieval circuit to be substituted for the parallel RC outlet circuit of FIG. 2.

Referring in detail to FIG. 4 there is illustrated a PNP transistor Q3 disposed in a line coupled to the power supply line V1 of FIG. 2 in a similar position to resistor R3 of FIG. 2, namely, to junction 18 of FIG. 2. Thus, the collector of transistor Q3 is coupled to junction 18 of FIG. 2 and the emitter is coupled through a resistor RSM which is much smaller than resistor R3 to the positive DC voltage supply at V1. A further resistor R6 is provided between the voltage supply terminal at V1 and the base of transistor Q3. The base of transistor Q3 is clamped above ground at, for example, 4.7 volts by a zener diode ZE coupled between the base of transistor Q3 and the negative DC supply line. A capacitor CC is provided as in FIG. 2 through which the amplified AC output signal is retrieved at terminal OT. A resistor R4 may be provided between terminal OT and the negative DC bias supply terminal V2 and may function either as a volumn control or an input impedance to an additional amplifier.

The operation and advantages of the circuit of FIG. 4 can best be understood by an illustrative example with Q3 chosen as a 2N3799 transistor, a 5.6 volt DC supply voltage, R6 equal to 40 Kohms, RSM 200 ohms and R4 82 Kohms. With these circuit parameters the present invention achieves excellent results in the level of the output signal.

Figure 5:
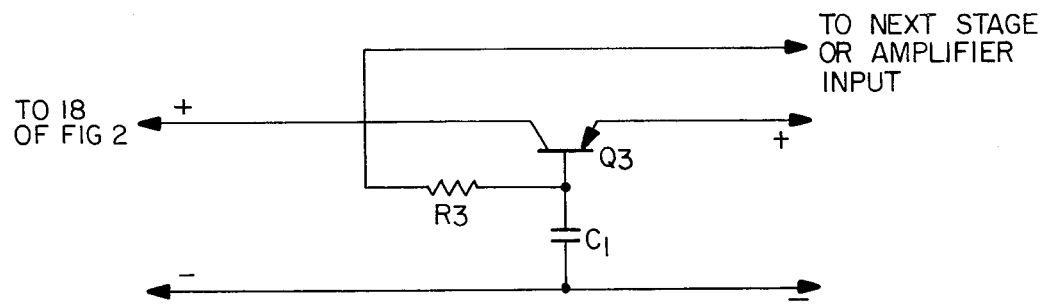
FIG. 5 is a second embodiment of a signal retrieval circuit for performing a similar function to the circuitry of FIG. 4.

The zener diode ZE of FIG. 4 is used in a preferred embodiment but, if desired, it can be replaced by a suitably sized resistor, capacitor as in FIG. 5.

Referring to FIG. 5, the transistor looking into the collector 18 of Q2 in FIG. 2 sees a practically infinite impedance shunted by the load (the next stage or amplifier input impedance). This, however, does not influence the DC supply current to the circuit in the contact microphone. The gain, therefore, for the stage is not limited by the requirements for DC current to the microphone. Resistor R3 is connected between the collector and base of transistor Q3, and capacitor C1 is connected between the base of Q3 and the negative terminal of a D.C. supply voltage source. The bypass capacitor C1 prevents negative feedback and loss of gain due to such feedback. This resistor R3 provides for the proper DC current through Q3 and proper quiescent voltage at the collector 18 of Q2 in FIG. 2. R3 is also a shunt to the load but due to the very low base-bias-current its resistance is high and therefore an insignificant shunt.

Figure 6:
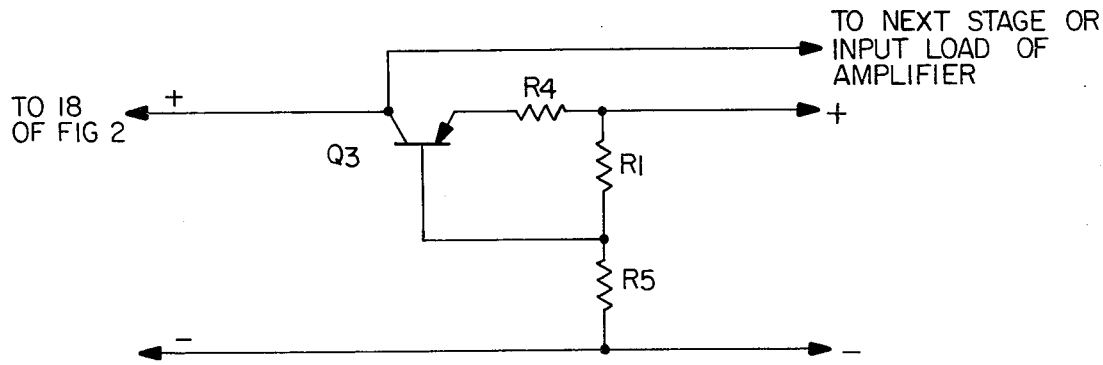
FIG. 6 is a third embodiment of a signal retrieval system for performing a similar function to both the circuits of FIGS. 4 and 5.

Referring to FIG. 6 there is illustrated another embodiment or modification of the circuit of FIG. 5. To avoid the loss due to R3, gate bias can also be provided with the voltage divider R1, R5. The capacitor C1 is omitted but R4 has to be added for circuit stability causing some loss of usable battery supply voltage. For both FIGS. 5 and 6 configurations the transistor and or JFET in the microphone should be a NPN transistor and an N channel JFET for a PNP transistor of Q3. When Q3 is an NPN transistor the semiconductor devices in the microphone should be PNP for transistor Q2 and P channel for JFET Q1.

It should be understood that the circuit and system described herein may be modified as would occur to one of ordinary skill in the art without departing from the spirit and scope of the present invention.

We claim:

1. A two wire sensing transducer and amplifier combination, comprising
   a piezoelectric transducer having first and second electrical leads,
   a junction field effect transistor (JFET) having drain, source, and gate electrodes,
   a first transistor having collector, emitter, and base electrodes,
   means for connecting one lead of the transducer to the gate electrode of said JFET,
   means for connecting said source and base electrodes together,
   first and second terminals connected, respectively, to said drain and collector electrodes and to the second lead of the transducer,
   a first voltage divider connected between said emitter electrode and said second terminal,
   a second voltage divider connected between said connected source and base electrodes and said first voltage divider, thereby to provide a first bootstrapping feedback connection to the base of the transistor means,
   a resistor means connected between said gate electrode and said second voltage divider, thereby to provide a second bootstrapping feedback connection to the gate of the JFET,
   first and second supply lines for providing connection to a D.C. voltage source,
   means for coupling said first and second terminals to said first and second supply lines, respectively, and
   output circuit means connected between said supply lines and separate from said transistor means and from said first and second terminals for coupling from said supply lines an output signal produced by said combination of transducer and amplifier.

2. The combination claimed in claim 1 wherein said output circuit means comprises,
   resistor means series connected in one of said D.C. supply lines and to one of said first and second terminals, and
   output terminal means connected between said resistor means and the first or second terminal to which the resistor means is connected.

3. The combination claimed in claim 1, wherein said output circuit means comprises,
   a second transistor having collector, emitter, and base electrodes and having its collector and emitter electrodes series connected in one of said D.C. supply lines,
   the collector electrodes of said first and second transistors being connected together by said one D.C. supply line.

4. The combination claimed in claim 3 wherein said second transistor has a base electrode clamped at a predetermined D.C. voltage by a Zener diode that has one end connected to a negative one of said D.C. supply line.

5. The combination claimed in claim 3 and including,
   resistor means coupled between base and collector electrodes of said second connected transistor, and
   a capacitor coupled between the base of said second transistor and the negative one of said D.C. supply lines.

6. The combination claimed in claim 3 including,
   a resistor in the emitter circuit of said second transistor,
   a voltage divider connected between the D.C. supply lines;
   means for coupling the base of said second transistor to the voltage divider at a predetermined point.

* * * * *